(12) United States Patent
Fujii et al.

(10) Patent No.: US 12,266,485 B2
(45) Date of Patent: Apr. 1, 2025

(54) SWITCH DEVICE

(71) Applicants: Yuichi Fujii, Aichi (JP); Takanori Okaniwa, Aichi (JP); Hidekazu Imai, Aichi (JP)

(72) Inventors: Yuichi Fujii, Aichi (JP); Takanori Okaniwa, Aichi (JP); Hidekazu Imai, Aichi (JP)

(73) Assignee: NIDEC MOBILITY CORPORATION, Aichi (JP)

( * ) Notice: Subject to any disclaimer, the term of this patent is extended or adjusted under 35 U.S.C. 154(b) by 142 days.

(21) Appl. No.: 18/171,671

(22) Filed: Feb. 21, 2023

(65) Prior Publication Data

US 2023/0268146 A1    Aug. 24, 2023

(30) Foreign Application Priority Data

Feb. 22, 2022   (JP) .................... 2022-025307

(51) Int. Cl.
  *H01H 19/04*    (2006.01)
  *H01H 19/14*    (2006.01)
  *H05K 1/18*    (2006.01)

(52) U.S. Cl.
  CPC ............ *H01H 19/04* (2013.01); *H01H 19/14* (2013.01); *H05K 1/181* (2013.01); *H05K 2201/10053* (2013.01)

(58) Field of Classification Search
  CPC .. H01H 19/04; H01H 19/14; H01H 2223/004; H01H 9/04; H01H 13/06; H01H 19/06; H01H 15/02; H01H 15/04; H01H 15/24; H01H 2221/014; H05K 1/181; H05K 2201/10053; H05K 1/18
  See application file for complete search history.

(56) References Cited

U.S. PATENT DOCUMENTS

| | | | |
|---|---|---|---|
| 7,838,784 B2 * | 11/2010 | Arisaka | G06F 1/1662 200/306 |
| 2009/0223798 A1 | 9/2009 | Miwa et al. | |
| 2020/0388452 A1 * | 12/2020 | Yamagata | H01H 25/06 |
| 2021/0247558 A1 | 8/2021 | Yamagata | |

(Continued)

FOREIGN PATENT DOCUMENTS

| | | |
|---|---|---|
| JP | 2004281102 A | 10/2004 |
| JP | 2004288393 A | 10/2004 |

(Continued)

*Primary Examiner* — Lheiren Mae A Caroc
(74) *Attorney, Agent, or Firm* — HAUPTMAN HAM, LLP

(57) ABSTRACT

A switch device includes: a printed circuit board; a rubber sheet configured to cover the printed circuit board; an operating knob; an operating mechanism; an operating mechanism plate; and a housing having a side surface provided with an insertion hole, and a bottom surface provided with a discharge hole for discharging liquid entering an inside of the housing; and a back cover that is fitted from a back side of the housing and sandwiches an entire periphery of the rubber sheet with a stepped portion formed inside the housing. The printed circuit board is stored in a space between the back cover and the rubber sheet. The discharge hole is located in a lower portion of a space between an inner surface of the housing and the rubber sheet. A bottom portion exists between the discharge hole and the rubber sheet.

1 Claim, 9 Drawing Sheets

(56) References Cited

U.S. PATENT DOCUMENTS

| | | | |
|---|---|---|---|
| 2022/0083090 A1 | 3/2022 | Saijo | |
| 2023/0095864 A1* | 3/2023 | Ryu | ................... H01H 25/002 |
| | | | 200/293 |
| 2023/0268144 A1* | 8/2023 | Fujii | ................... B60R 16/02 |
| | | | 200/5 A |

FOREIGN PATENT DOCUMENTS

| | | |
|---|---|---|
| JP | 2009218064 A | 9/2009 |
| JP | 2016213120 A | 12/2016 |
| WO | 2020121688 A1 | 6/2020 |
| WO | 2020255495 A1 | 12/2020 |

* cited by examiner

SWITCH DEVICE

CROSS-REFERENCE TO RELATED APPLICATIONS

This application is based upon and claims the benefit of priority from Japanese Patent Application No. 2022-025307 filed on Feb. 22, 2022, the entire contents of which are incorporated herein by reference.

FIELD

One or more embodiments of the present invention relate to a switch device.

BACKGROUND

In the related art, there has been known a switch device configured with a printed circuit board having an electrical contact, an operating mechanism for conducting and interrupting the electrical contact, and a housing for housing them. For example, JP2004-281102A discloses a centralized arrangement switch aimed at centralized arrangement of the switch. In this switch, a thin switch including a front sheet with a dome-shaped protruding portion is provided on a surface of a switch knob to constitute a power seat switch of a vehicle as a centralized arrangement switch. Since the power seat switch may be exposed to rainwater or dust, it is equipped with a dustproof/waterproof boot using a flexible sheet-shaped member made of rubber.

In addition, WO2020/121688A1 discloses a power seat switch that has an object to suppress light emitted by a light-emitting body provided on a board from leaking through a through hole of a cover without passing through a light-transmitting cover. The switch includes a housing, a board provided inside the housing, a light-emitting body mounted on one side of the board, and an elastic sheet covering one side of the board and the light-emitting body and guiding light from the light-emitting body. The housing has a through hole corresponding to one side of the board. The elastic sheet has, on a surface of a part corresponding to the through hole, a mirror surface portion for totally reflecting light passing through the inside thereof. In addition, the entire surface of the board is covered with a rubber sheet (elastic sheet) to improve waterproofness.

In addition, JP2004-288393A discloses a power seat switch device for a vehicle which is excellent in assembling and operability. This power seat switch device includes a lower case, a wiring board housed in the lower case, first and second connector terminals connected to one end of the wiring board, first to fourth lever switches mounted on the wiring board, first to fourth driving bodies individually disposed above each lever switch, an upper case which is combined with the lower case and constitutes a case of the switch device, a first operating knob connecting the first to third driving bodies, and a second operating knob connected to the fourth driving body.

In addition, JP2016-213120A discloses a rotary switch device that is free from rattling and has a stable operation feeling. This switch device includes a switch member, a support body that stores the switch member, an operating knob rotatably supported by the support body, a slider member that reciprocates as the operating knob rotates, and a drive member that drives the switch member corresponding to the reciprocating movement of the slider member. The support body has a shaft portion for rotatably supporting the operating knob, and the operating knob has a shaft-side end portion provided with a bearing portion into which the shaft portion is inserted, and a rotation-side end portion in which the slider member is connected without a gap. An inner peripheral surface of the bearing portion surrounds an outer peripheral surface of the shaft portion with a gap, and at least one of the shaft portion and the bearing portion is provided with an energizing portion to energize the operating knob from the slider member toward the shaft portion.

In addition, JP2009-218064A discloses a slide operation type electrical component in which a click feeling during slide operation can be set relatively freely and an increase in size can be easily avoided. In this electrical component, a slider has a pair of ridge portions extending along a predetermined direction, and each ridge portion is inserted into a guide path of a holding case so as to slide along a guide surface. The ridge portion is provided with a notch that is open on a protruding end surface side thereof, and a steel ball that is elastically energized by a coil spring is in elastic contact with an inner wall surface of the notch. A shape of the notch tapers from an opening end side toward a back side, and the steel ball engages and disengages from a click groove formed at the deepest part of the notch to generate a click feeling. The coil spring is housed in a spring housing portion of the holding case, and this spring housing portion is provided so as to protrude from the guide path and to be continuous with the guide surface.

In addition, WO2020/255495A1 discloses an operating device including an operating knob, an actuator, a first switch, a second switch, and a holder. An storing space of the holder has a first storing portion that extends in a first direction, stores a first arm portion of the actuator, and guides the first arm portion in a pushing direction of the first switch, and a second storing portion that extends in a second direction, stores a second arm portion of the actuator, and guides the second arm portion in a pushing direction of the second switch. The first arm portion or the first storing portion has a permitting portion that avoids interference between the first arm portion and the first storing portion and permits the actuator to tilt in the second direction, and the second arm portion or the second storing portion has a permitting portion that avoids interference between the second arm portion and the second storing portion and permits the actuator to tilt in the first direction.

SUMMARY

One or more embodiments of the present invention provide a switch device that enhances a waterproof function of a rubber sheet and facilitates discharge of infiltrated liquid.

In one or more embodiments of the present invention, there is provided a switch device including: a printed circuit board which includes an electrical contact and on which an electronic component is mounted; a rubber sheet configured to cover the printed circuit board, the rubber sheet having a rubber dome at a position corresponding to the electrical contact; an operating knob configured to operate the rubber dome, the operating knob being operable for turning on/off the electrical contact; an operating mechanism interposed between the operating knob and the rubber dome, the operating mechanism being configured to transmit force applied to the operating knob to the rubber dome; an operating mechanism plate on which the operating mechanism is provided; and a housing having a side surface provided with an insertion hole for inserting a part of the operating mechanism, the part of the operating mechanism being connected to the operating knob, and a bottom surface provided with a discharge hole for discharging liquid entering an inside of the housing; and a back cover that is fitted from a back side of the housing and sandwiches an entire periphery of the rubber sheet with a stepped portion formed inside the housing, wherein the printed circuit board is stored in a space between the back cover and the rubber sheet, wherein the discharge hole is located in a lower portion of a space between an inner surface of the housing and the rubber sheet, and wherein a bottom portion exists between the discharge hole and the rubber sheet.

According to this, the discharge hole located at the bottom surface of the housing is located in a lower portion of the space between the inner surface of the housing and the rubber sheet and separately from the rubber sheet so that the bottom portion exists between the discharge hole and the rubber sheet, thereby providing a switch device that keeps the liquid away from the connection part (stepped portion) between the rubber sheet and the housing, prevents the liquid from infiltrating from there, enhances the waterproof function of the rubber sheet, and facilitates the discharge of the infiltrated liquid.

As described above, according to one or more embodiments of the present invention, it is possible to provide a switch device that enhances the waterproof function of the rubber sheet and facilitates the discharge of the liquid entering the housing.

BRIEF DESCRIPTION OF DRAWINGS

FIG. 3A is a perspective view showing the whole, FIG. 3B is a perspective view in a case where an operating knob is removed, FIG. 3C is a perspective view in a case where a housing on a front side is further removed, FIG. 3D is a perspective view in a case where a surface part of the housing is removed while leaving a discharge path and is seen from a front side of FIG. 3C, and FIG. 3E is a perspective view of a rubber sheet and a printed circuit board with an operating mechanism plate further removed;

FIG. 6A is a perspective view showing the whole, FIG. 6B is a perspective view in a case where a back cover is removed, and FIG. 6C is a perspective view in a case where the printed circuit board is further removed;

FIG. 7A is a perspective view in a case where the rubber sheet is removed, and FIG. 7B is a perspective view in a case where the operating mechanism plate is removed;

FIG. 8A is a perspective view in a case where the rubber sheet is removed, and FIG. 8B is a perspective view in a case where the operating mechanism plate is removed.

DETAILED DESCRIPTION

Figure 1A:
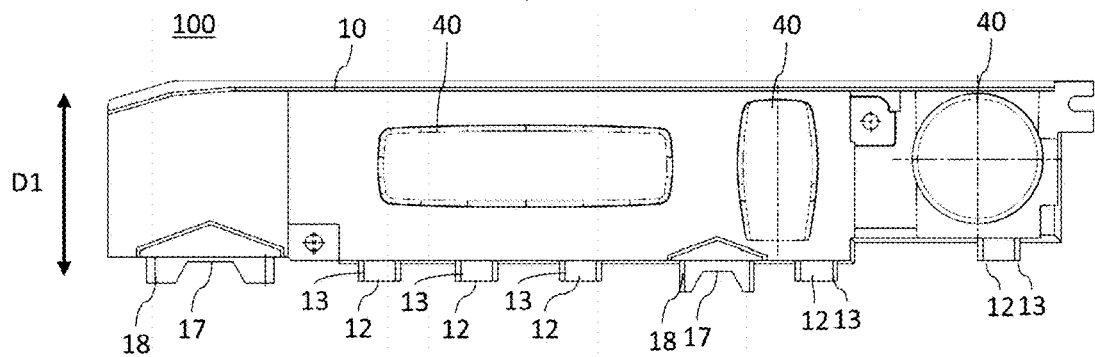
FIG. 1A is a front view.

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention.

Hereinafter, an embodiment of the present invention will be described with reference to drawings.

First Embodiment

A switch device 100 according to the present embodiment will be described with reference to FIGS. 1A to 9. The switch device 100 is mounted on a vehicle, receives power supply from a battery of the vehicle, and performs on/off control of a motor that drives a predetermined part based on an operation of a user. The switch device 100 has excellent water resistance, as will be described later, and is assumed to be installed in parts in which there is a possibility of being exposed to rainwater or drinks, such as near doors and seats inside the vehicle. The switch device 100 presented as an embodiment is a switch provided on a side surface of the seat on a side of a driver's seat door for operating a power seat.

The switch device 100 includes a housing 10, a printed circuit board 20, a rubber sheet 30, an operating knob 40, an operating mechanism 50, an operating mechanism plate 60, and a back cover 70. When seen from the front, the housing 10 has a horizontally long, generally rectangular shape to fit the side surface of the seat, and has a thickness that stores the printed circuit board 20, the rubber sheet 30, and the operating mechanism plate 60 therein so as to be generally parallel to the front. That is, the printed circuit board 20, the rubber sheet 30, and the operating mechanism plate 60 stored inside are placed vertically such that these planes are generally perpendicular to the ground when the switch device 100 is installed in the vehicle. A back surface of the housing 10 is open, but after the contents to be stored inside are housed, the back cover 70 serves as a lid and is closed. The switch device 100 is installed with the side of the back cover 70 facing the seat and the front side facing the door.

The printed circuit board 20 is mounted with electrical contacts 21, electronic components (not shown), and a connector 22 for electrical connection with the outside. The electrical contact 21 typically constitutes a part of a membrane switch, but is not limited to this. For example, a conductive material may be applied to a rubber dome to be described later, and the electrical contact may be constituted to conduct by the rubber dome contacting the electrical contact 21 on the surface of the board. The connector 22 is mounted facing a downward direction at a lower portion of the printed circuit board 20, which makes it difficult for the user to visually recognize and easy to connect to the power supply and the motor. The electronic component uses power from the power supply to generate signals for driving the motor.

The rubber sheet 30 is a flexible sheet made of rubber that covers the printed circuit board 20 and has rubber domes 31 at positions corresponding to electrical contacts 21. The rubber sheet 30 covers not only the planar printed circuit board 20 but also the connector 22 provided so as to rise from the printed circuit board 20. The rubber dome 31 is provided at a position corresponding to the electrical contact 21 provided on the printed circuit board 20. When the rubber dome 31 is pressed by the operating mechanism 50, which will be described later, the rubber dome 31 is recessed to conduct the electrical contact 21, and when the pressure is removed, the rubber dome 31 separates from the electrical contact 21 by the elastic force and cuts off. The rubber sheet 30 covers all the connectors 22, electrical contacts 21, and electronic components on the printed circuit board 20 through which electricity flows, and prevents the printed circuit board 20 from being exposed to water even in a case where the switch device 100 is exposed to water.

A plurality of operating knobs 40 is provided on the front side for driving a predetermined part of the driver's seat in a predetermined direction. For example, one of the plurality of operating knobs 40 is used to move the seat surface back and forth and up and down, and the other one of the operating knobs 40 is used to move a backrest up and down. Therefore, the operating knob 40 is often operated in an up and down direction (D1 direction in FIG. 1A and FIG. 2), and this operating force is applied to the switch device 100. In a case where the operating knob 40 is operated by the user, the movement is propagated to the operating mechanism 50, and the operating knob 40 operates the rubber dome 31 via the operating mechanism 50 to turn on/off the electrical contact 21.

Figure 9:
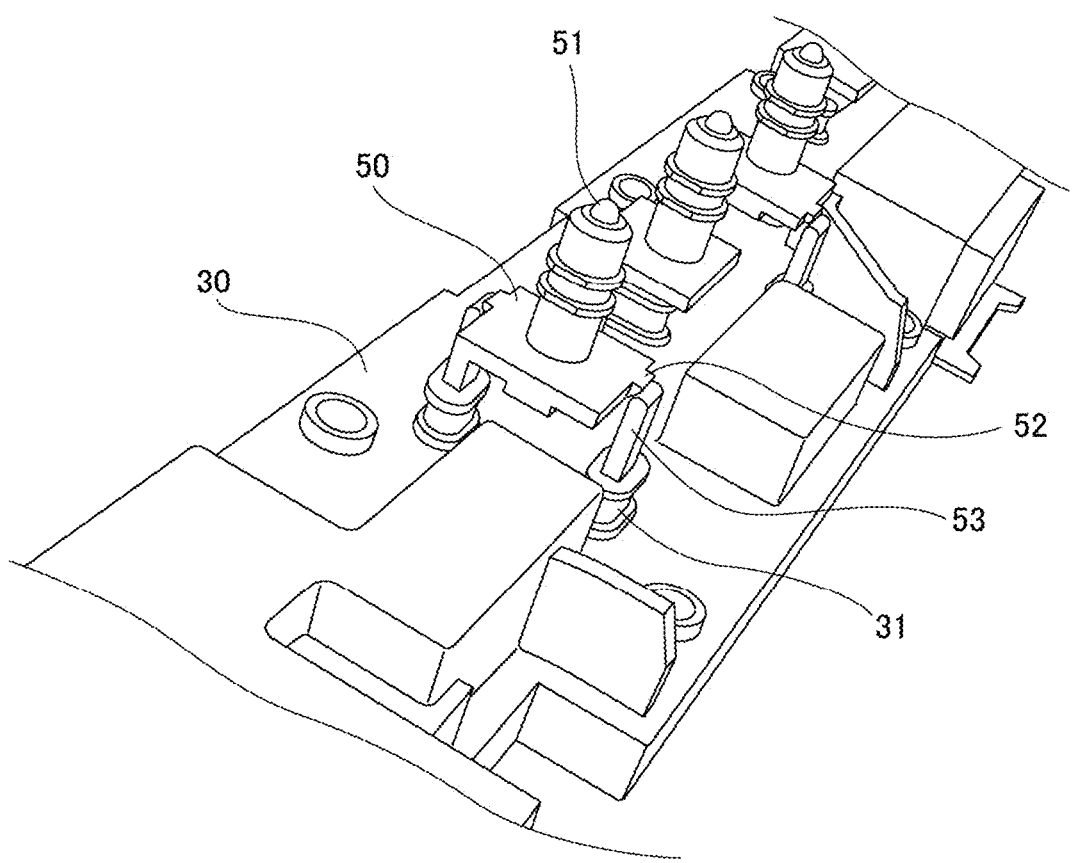
FIG. 9 is a perspective view of the switch device according to the first embodiment as seen from a front left lower side in a case where the operating knob, the housing on a front side and the operating mechanism plate are removed while the operating mechanism remains.

The operating mechanism 50 has a connection portion 51 connected to the operating knob 40, a slide portion 52, and a plunger 53 (FIG. 9). The connection portion 51 is exposed from the front of the housing 10 through an insertion hole 11 provided on the side surface of the housing 10 on the front side, and is connected to the operating knob 40. The slide portion 52 is stored in the housing 10 and slides along with the operating knob 40 in a D1 direction. The plunger 53 is a member that changes a moving direction of the slide portion 52 to its vertical direction, that is, a direction perpendicular to the printed circuit board 20 and the rubber sheet 30.

For example, in a case where the operating knob 40 is operated in a downward direction of D1 by the user, the slide portion 52 slides in the downward direction along with it and pushes down a tip of the plunger 53 located below (downward in FIG. 9). The plunger 53 is configured such that in a case of being pushed down, the other tip abuts against the rubber dome 31 and pushes it down, thereby turning on the electrical contact 21 of the printed circuit board 20. In this manner, the operating mechanism 50 is interposed between the operating knob 40 and the rubber dome 31 and transmits the force applied to the operating knob 40 to the rubber dome 31. Although not shown, the operating mechanism 50 also has an elastic member that energizes the slide portion 52 in a predetermined direction, a member that generates a switch feeling, and the like.

The operating mechanism plate 60 is a strong base on which a plurality of the operating mechanisms 50 is provided, supports each operating mechanism 50, and is configured to withstand the operating force applied via the operating knob 40. Although the operating mechanism plate 60 is attached to the frontmost side inside the housing 10, the operating mechanism plate 60 has support portions 62 that are fitted into support holes 14 provided on the top surface and bottom surface of the housing 10 (FIG. 2), and thus, the housing 10 is firmly attached. As can be seen from the cross-sectional view of FIG. 2, the front view of FIG. 1A, and the bottom view of FIG. 1B, the positions of the support portions 62 in the operating mechanism plate 60 and the operating mechanism 50, and the positions of the support hole 14 and the insertion hole 11 in the housing 10 corresponding to them coincide in an operation direction D1 of the operating knob 40 in a case where when seen from the front side.

The support hole 14 is provided directly below the insertion hole 11 through which the connection portion 51 of the operating mechanism 50, in which the operating knob 40 moves up and down and the slide portion 52 moves up and down, is inserted. That is, with such a configuration, the force in the operation direction D1 applied to the operating knob 40 disposed on the front of the switch device 100 can be firmly supported via the support portion 62 by the support hole 14 disposed directly above the insertion hole 11 on the top surface and directly below the insertion hole 11 on the bottom surface, and the strength of the operating mechanism 50 can be ensured. In the present embodiment, the support hole 14 is a hole penetrating the surface and an inner surface of the housing 10, but it may be a recessed hole that engages with the support portion 62 without penetrating.

Figure 1B:
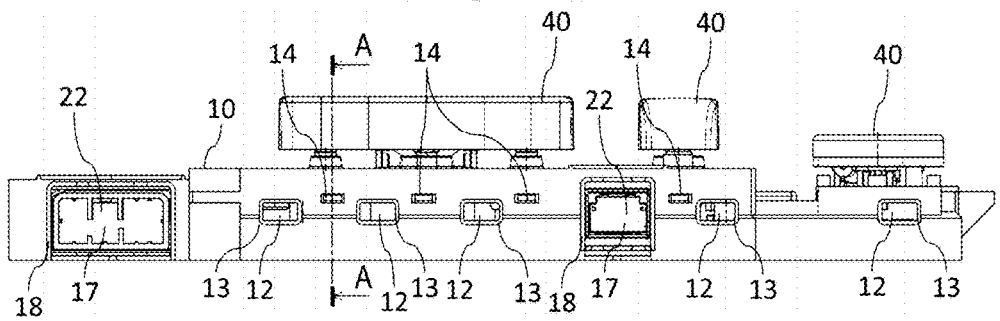
FIG. 1B is a bottom view.
Figure 1C:
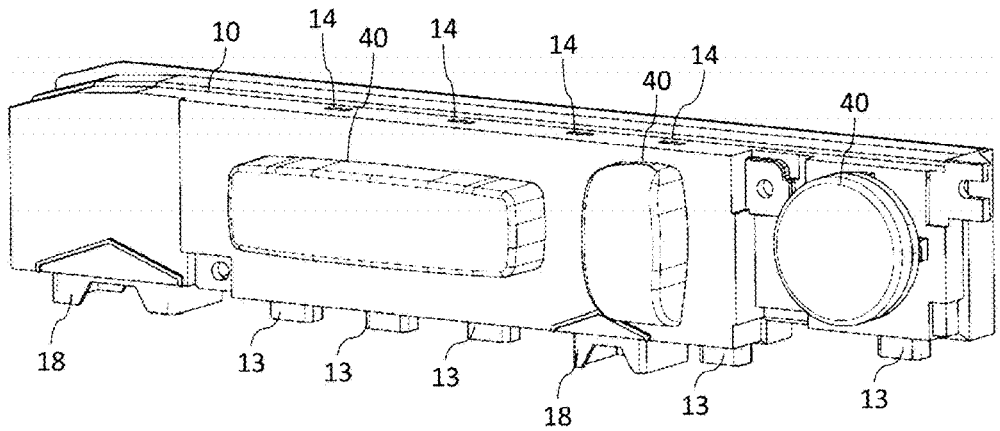
FIG. 1C is a perspective view as seen from a front right upper side.
Figure 1D:
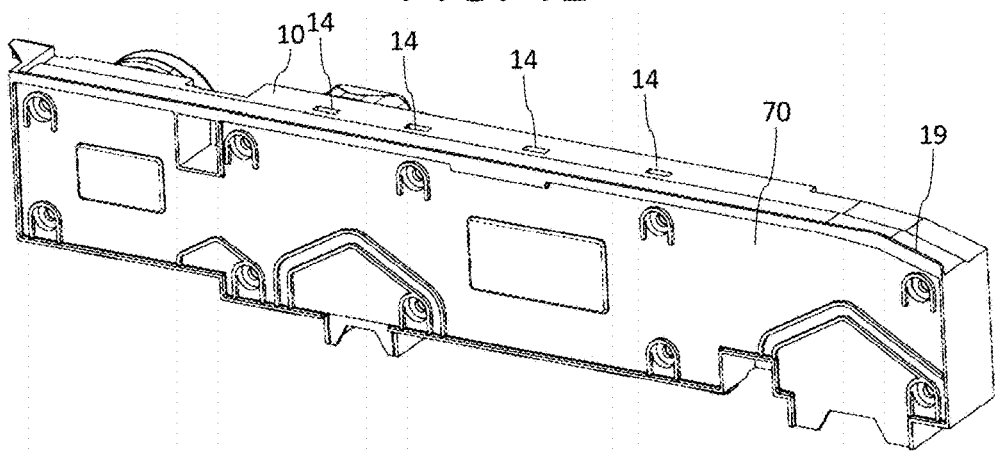
FIG. 1D is a perspective view as seen from a back left upper side of a switch device according to a first embodiment of the present invention.

In addition, the housing 10 has a discharge hole 12 on the bottom surface for discharging the liquid entering the inside of the housing 10. A position of the discharge hole 12 is shifted from a position of the insertion hole 11 in the operation direction D1 of the operating knob 40. That is, the support holes 14 are provided on the bottom surface directly below corresponding to each insertion hole 11, the discharge holes 12 are provided between the support holes 14, and the discharge holes 12 and the support holes 14 are alternately disposed on the bottom surface (FIG. 1B or the like). Since the liquid may enter the housing 10 through the insertion hole 11 through which a part of the operating mechanism 50 is inserted, although it is preferable that the discharge hole 12 is originally directly below the insertion hole 11, as will be described later, by providing a configuration in which the liquid entering the housing is guided to the discharge hole 12, the strength of the operating mechanism can be secured and the liquid entering the housing 10 can be easily discharged even in a case where the discharge hole 12 is shifted in the operation direction D1.

Figure 2:
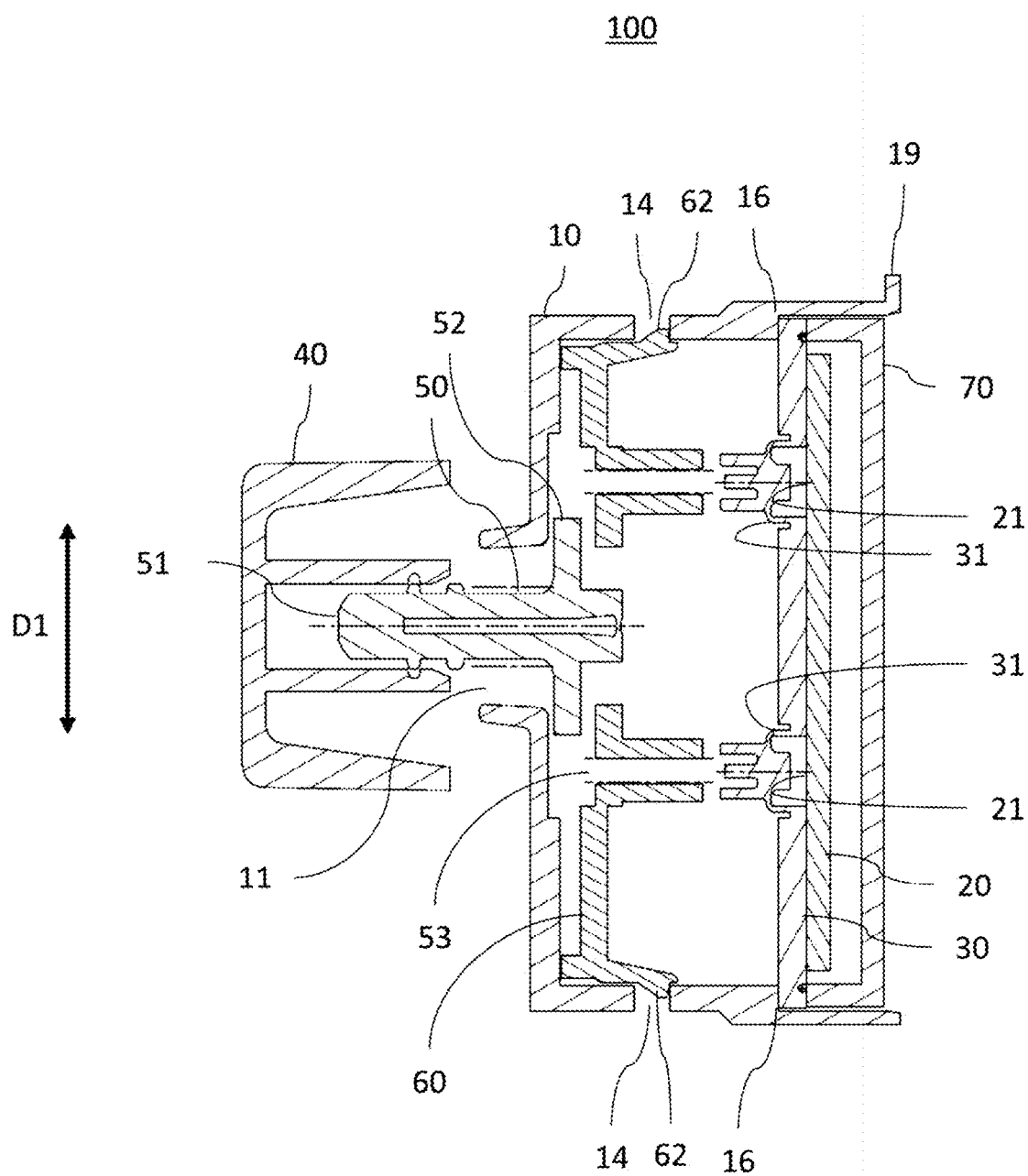
FIG. 2 is a cross-sectional view of the switch device according to the first embodiment of the present invention, taken along the A-A cross section in FIG. 1B.
Figure 5:
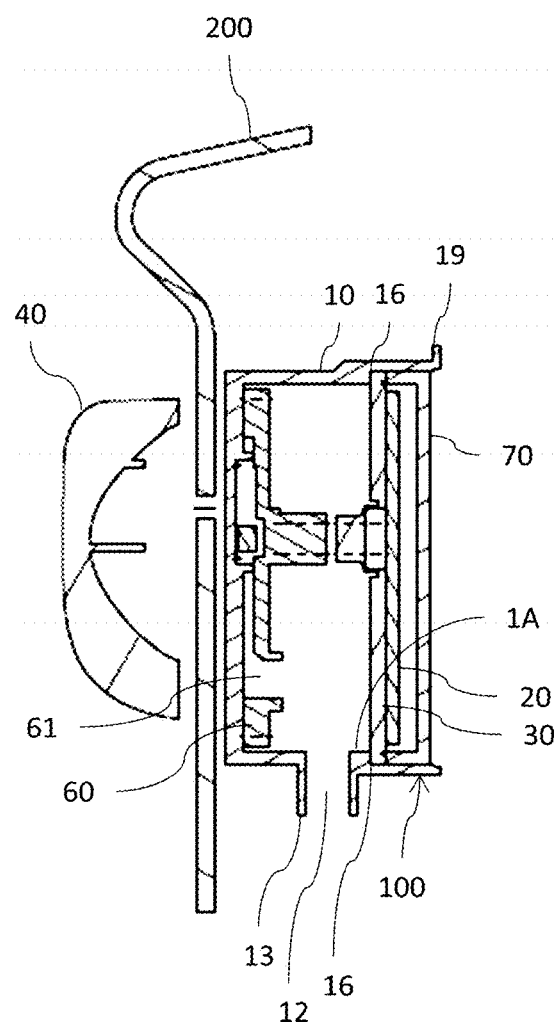
FIG. 5 is a cross-sectional view of the assembly that is composed of the switch device and the cover according to the first embodiment of the present invention, taken along the B-B cross section in FIG. 4A.
Figure 6A:
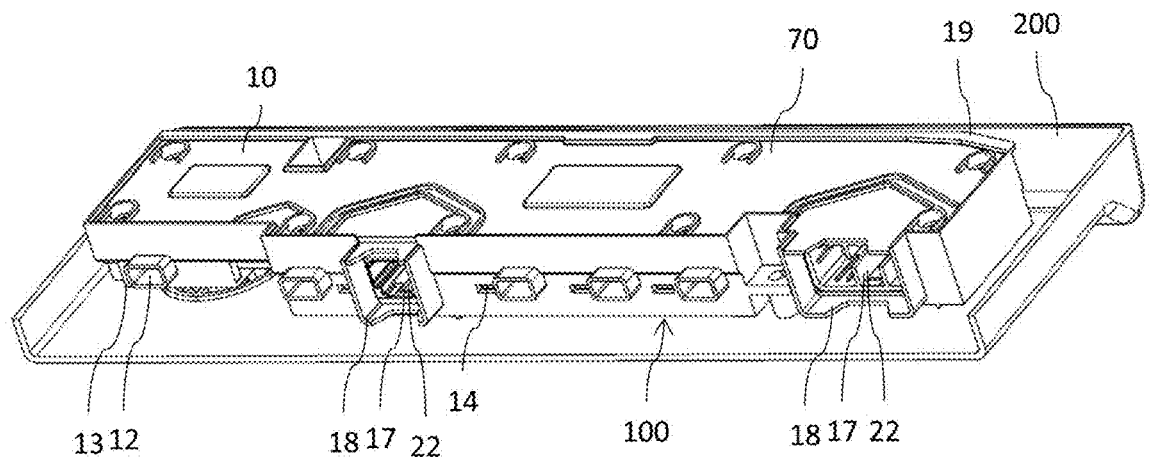
FIGS. 6A to 6C are perspective views of the assembly that is composed of the switch device and the cover according to the first embodiment of the present invention, as seen from a back right lower side.
Figure 6B:
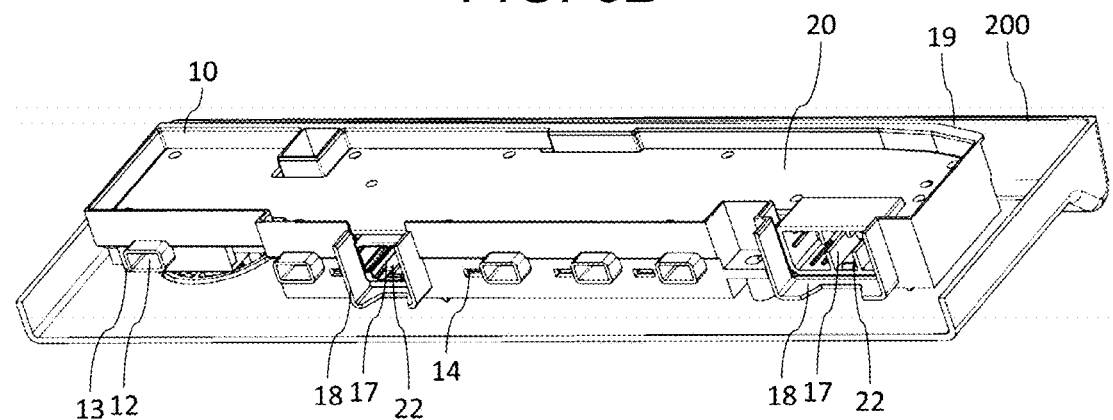
Figure 6C:
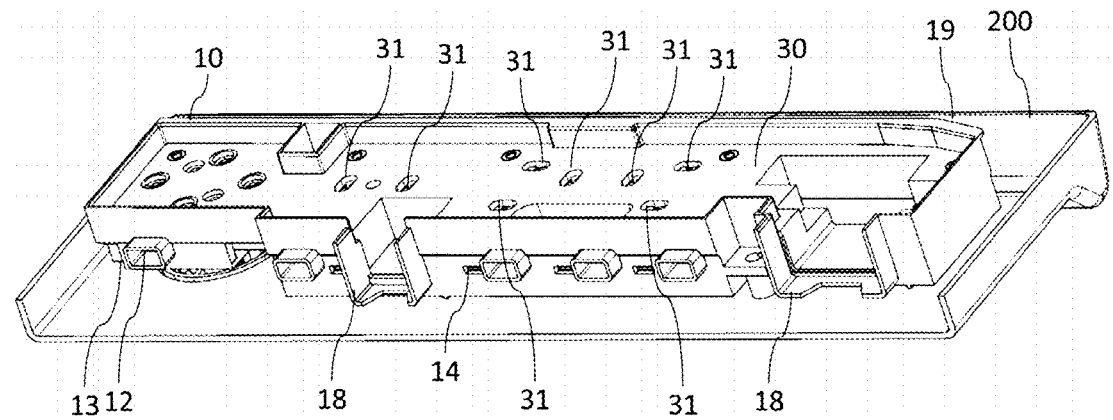
Figure 7A:
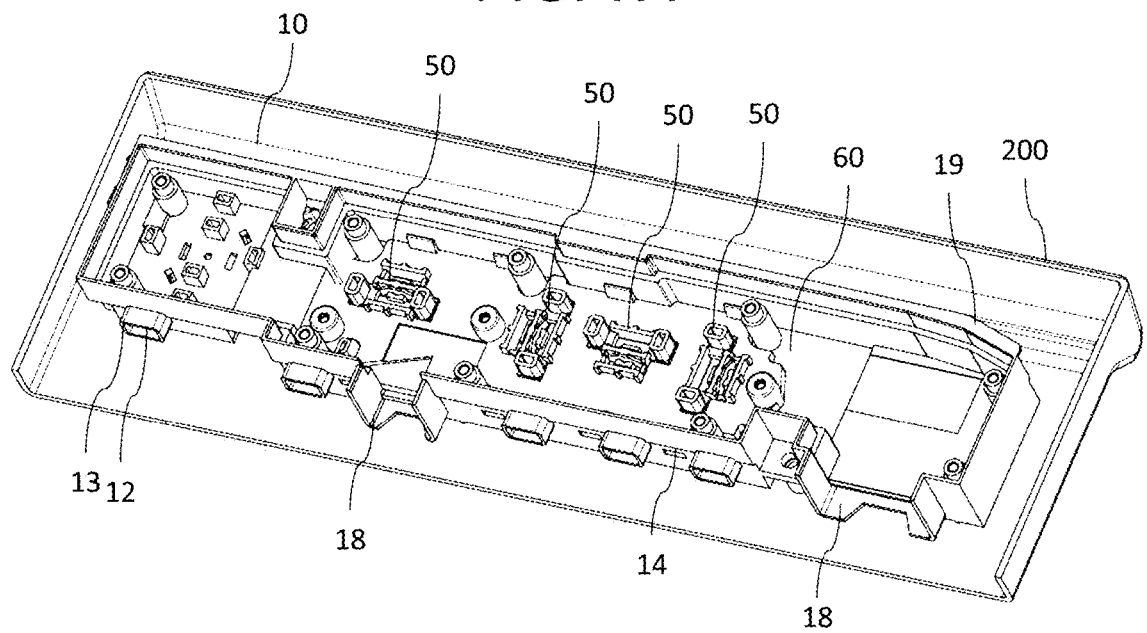
FIGS. 7A and 7B are perspective views of the assembly that is composed of the switch device and the cover according to the first embodiment of the present invention, as seen from the back right lower side.
Figure 7B:
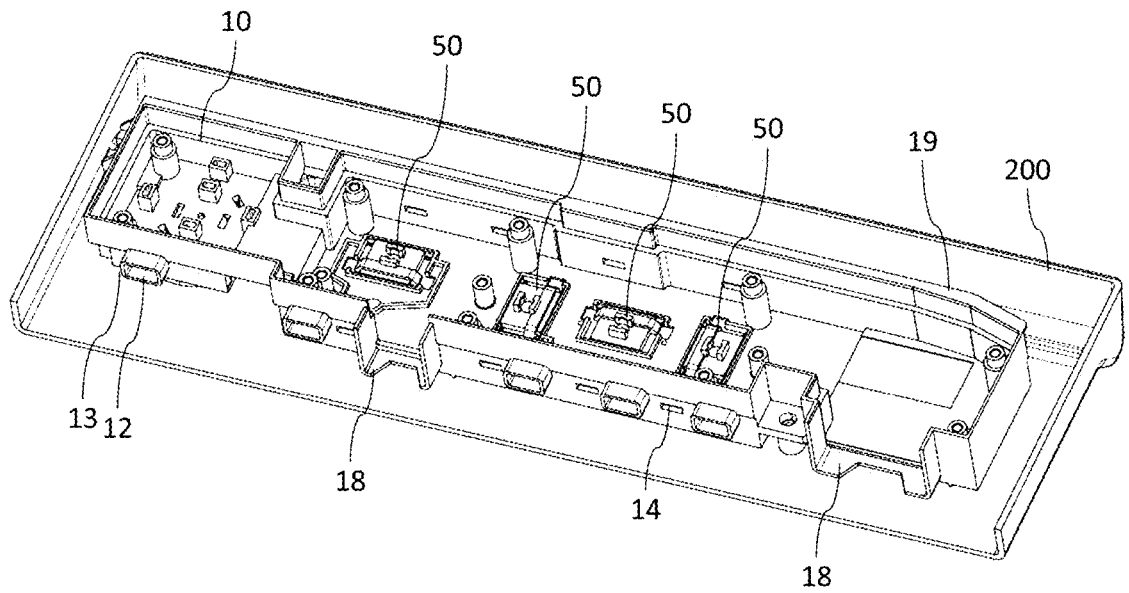
Figure 8A:
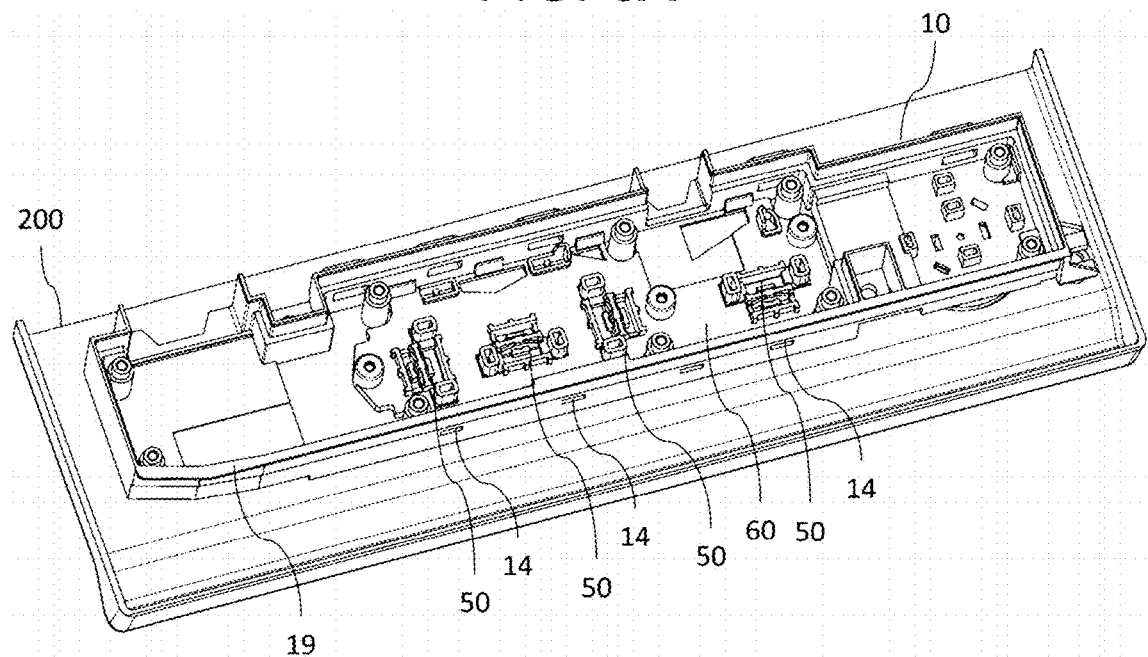
FIGS. 8A and 8B are perspective views of the assembly that is composed of the switch device and the cover according to the first embodiment of the present invention, as seen from the back left upper side.
Figure 8B:
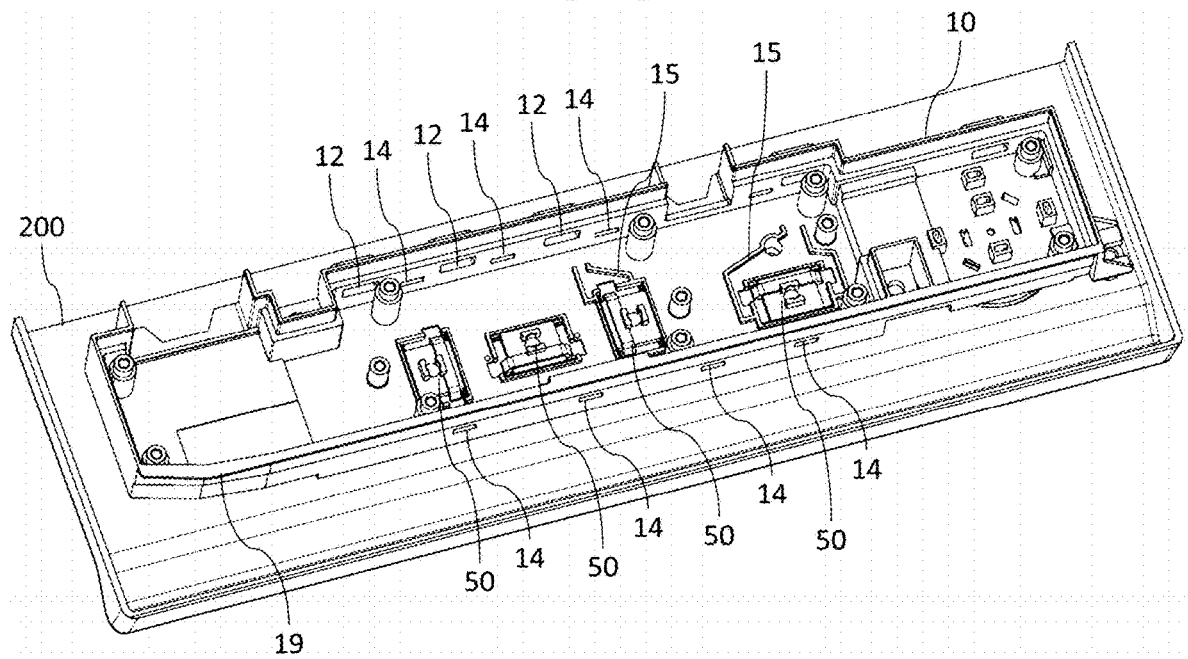

The housing 10 stores the operating mechanism plate 60, the rubber sheet 30, and the printed circuit board 20 therein in order from the front, and the back cover 70 is fitted from the back side of the housing 10 and is closed. When the back cover 70 is fitted to the housing 10, it is fitted such that the entire periphery of the rubber sheet 30 is sandwiched between the stepped portions 16 formed inside the housing 10 (FIGS. 2 and 5). As a result, the printed circuit board 20 through which electricity flows can be stored in a space between the back cover 70 and the rubber sheet 30, and the printed circuit board 20 can be prevented from being exposed to water by sandwiching the entire periphery.

The discharge hole 12 is located on the inner surface of the front side of the housing 10, more specifically, in a lower portion of a space between the operating mechanism plate 60 and the rubber sheet 30, and the discharge hole 12 is provided so that a bottom portion 1A exists between the discharge hole 12 and the rubber sheet 30 (FIG. 5). The bottom portion 1A is a part of the housing 10 and is provided between the discharge hole 12 and the stepped portion 16. According to this, the discharge hole 12 located at the bottom surface of the housing is located in a lower portion of the space between the inner surface of the front side of the housing 10 and the rubber sheet 30 and separately from the rubber sheet 30 so that the bottom portion 1A exists between the discharge hole 12 and the rubber sheet 30. Therefore, the liquid is kept away from the connection part (stepped portion 16) between the rubber sheet 30 and the housing 10 to prevent entry of the liquid from there, so that the waterproof function of the rubber sheet 30 is enhanced and discharging the liquid entering the housing 10 becomes easier.

Figure 4A:
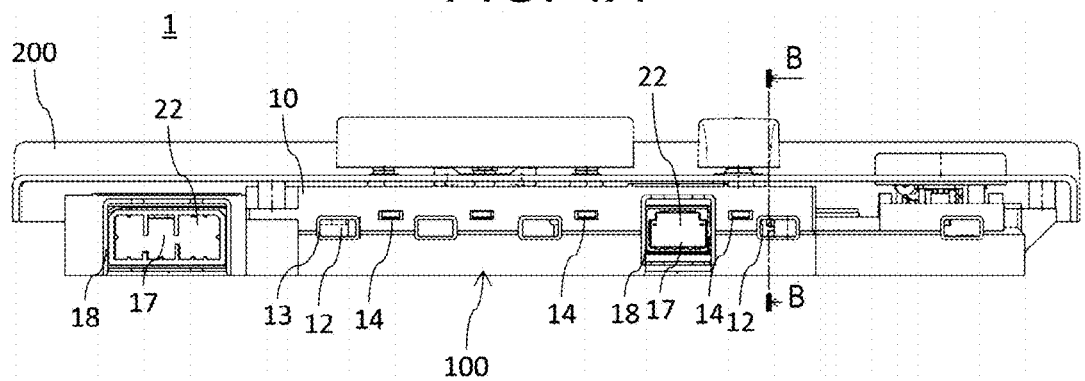
FIG. 4A is a bottom view.
Figure 4B:
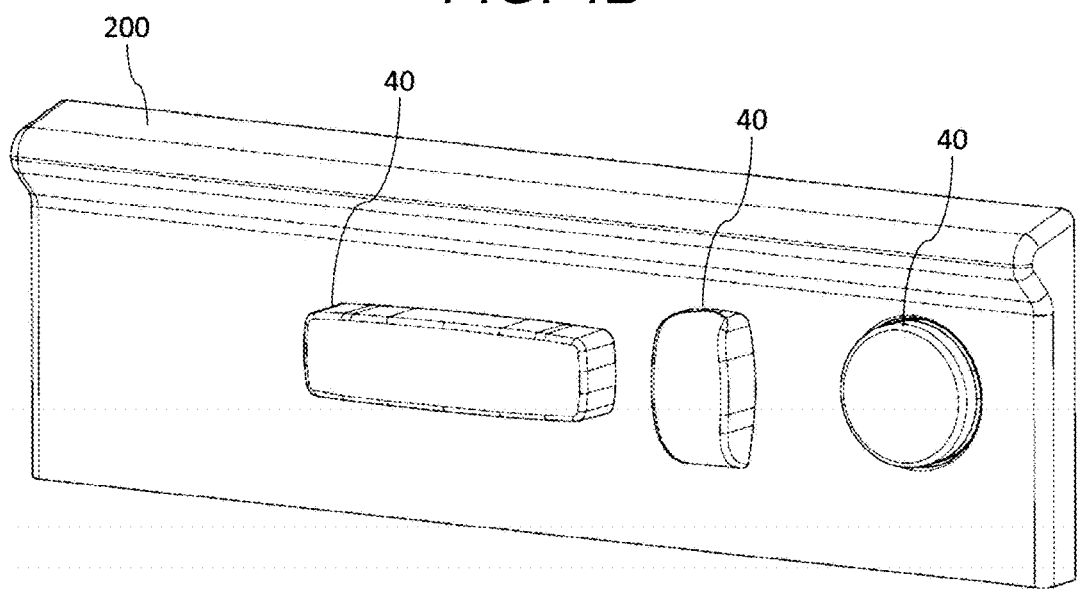
FIG. 4B is a perspective view as seen from the front right upper side.
Figure 4C:
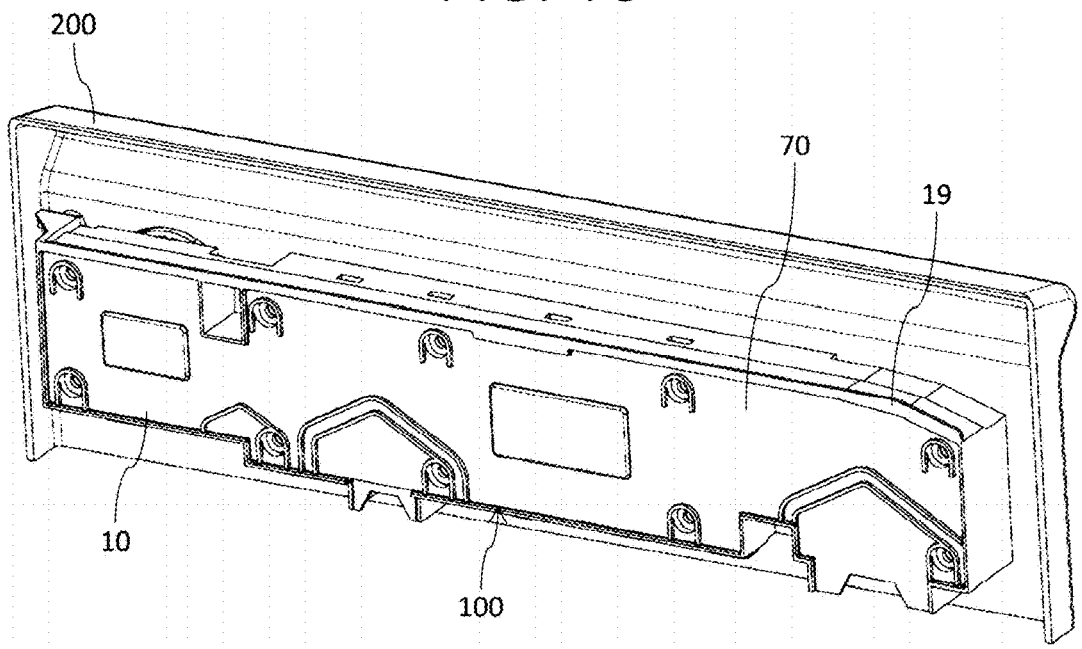
FIG. 4C is a perspective view as seen from the back left upper side of an assembly that is composed of the switch device and a cover according to the first embodiment of the present invention.

In addition, the housing 10 has a connector opening 17 on the bottom surface, which is provided for external connection to the connector 22 which is provided to face the downward direction at the lower portion of the printed circuit board 20. The connector opening 17 is provided on the bottom surface with a predetermined distance from the discharge hole 12. The predetermined distance is a distance at which the liquid discharged from the discharge hole 12 does not splash into the connector opening 17, and is appropriately determined. For example, as shown in FIG. 4A, the distance is such that the support hole 14 exists between the connector opening 17 and the discharge hole 12. In this manner, the discharge hole 12 and the connector opening 17 that are provided in the bottom surface of the housing 10 are disposed separately from each other by a predetermined distance such as by disposing the support hole 14. Therefore, it is possible to prevent the liquid, which enters the housing 10 and is discharged from the discharge hole 12, from entering the connector 22.

In a case where the liquid such as rainwater or drinks is splashed from above the switch device 100, it is conceivable that the liquid may enter the housing 10 through the insertion hole 11 from the top surface of the housing 10 along the side surface of the front side. The liquid entering the housing 10 through the insertion hole 11 flows into a space between the inner surface of the housing 10 and the operating mechanism plate 60. The liquid flowed into the space between the inner surface of the housing 10 and the operating mechanism plate 60 flows to the sides of the bottom surface of the insertion hole 11 and the operating mechanism 50 because the operating mechanism plate 60 and the printed circuit board 20 are placed vertically when the switch device 100 is installed.

Figure 3A:
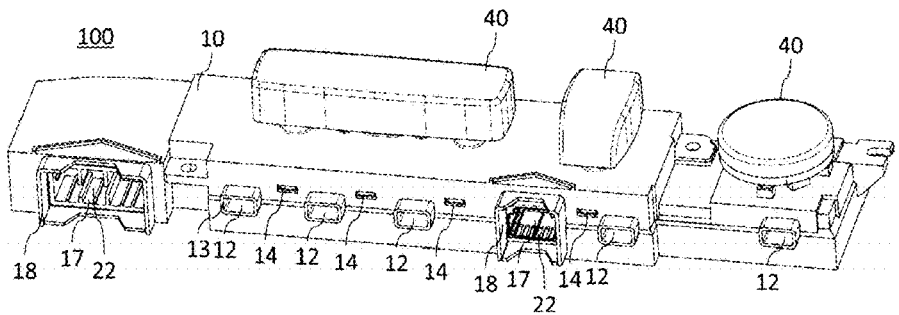
FIGS. 3A to 3E are perspective views of the switch device according to the first embodiment of the present invention as seen from a front right lower side.
Figure 3B:
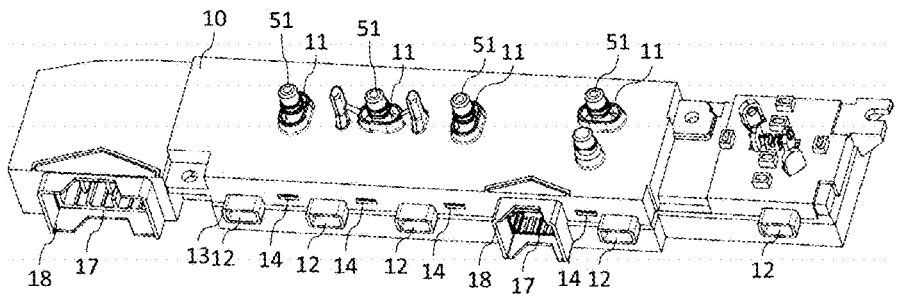
Figure 3C:
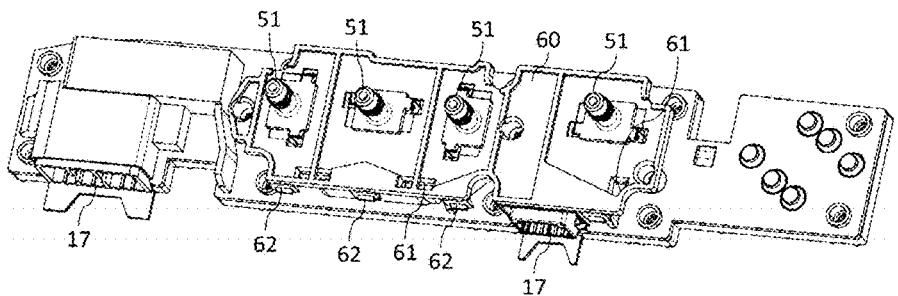
Figure 3D:
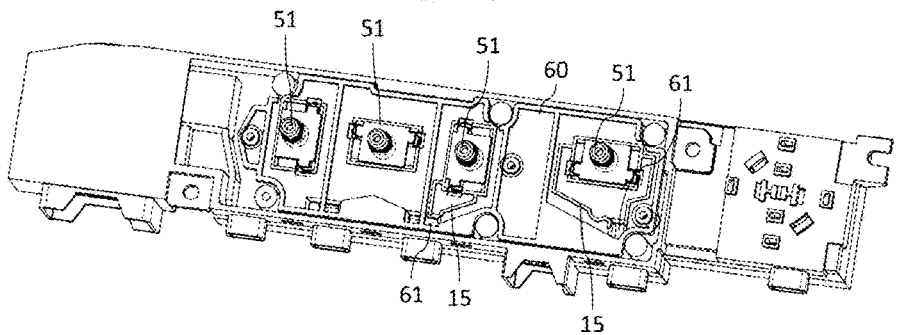

The operating mechanism plate 60 has a communication hole 61 that communicates the space between the operating mechanism plate 60 and the rubber sheet 30 and the space between the inner surface of the housing 10 on the side surface of the front side and the operating mechanism plate 60, on the side of the bottom surface of the operating mechanism 50 (FIG. 3C, FIG. 3D, and FIG. 5). The liquid flowed into the space between the inner surface of the housing 10 and the operating mechanism plate 60 flows through the communication hole 61 into the space between the operating mechanism plate 60 and the rubber sheet 30, and is discharged through the discharge hole 12 that is provided on a bottom surface of this space.

In addition, it is preferable that a discharge path 15 is provided in a space between the inner surface of the side surface of the housing 10 on the front side and the operating mechanism plate 60, which is on the side of the bottom surfaces of the insertion hole 11 and the operating mechanism 50, to guide the liquid entering the housing 10 through the insertion hole 11 to the communication hole 61. In this manner, the discharge path 15 that guides the liquid entering the housing 10 through the insertion hole 11 to the communication hole 61 communicating between spaces of the both sides of the operating mechanism plate 60 is provided in the space between the inner surface of the side surface of the housing 10 on the front side and the operating mechanism plate 60, which is closer to the side of the bottom surface than the insertion hole 11 and the operating mechanism 50. Therefore, when the switch device 100 is installed, in the switch device in which the printed circuit board 20 is vertically placed, the liquid entering the housing 10 can be easily discharged from the discharge hole 12.

In the present embodiment, the discharge path 15 extends from the side of the inner surface of the side surface of the housing 10 on the front side toward the operating mechanism plate 60, and a tip thereof abuts against the operating mechanism plate 60. However, the discharge path is not limited to this, and may extend from a surface of the operating mechanism plate on the housing side toward the front of the housing, and the tip thereof may abut against the inner surface of the housing. In any case, by forming such a discharge path, the liquid that has entered the housing 10 through the insertion hole 11 is smoothly guided to the communication hole 61 and discharged from the inside of the switch device 100 at an early stage.

Figure 3E:
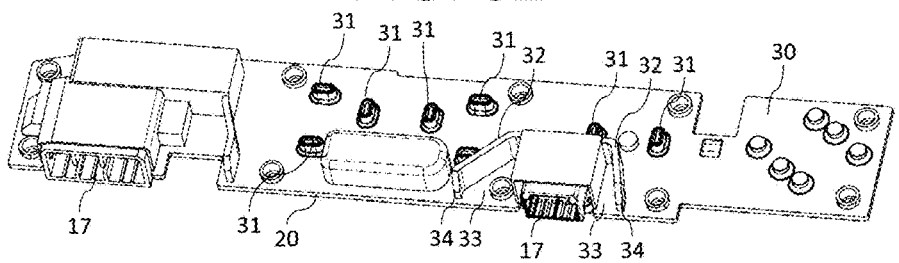

In addition, the liquid that has flowed into the space between the operating mechanism plate 60 and the rubber sheet 30 through the communication hole 61 normally flows toward the discharge hole 12 provided below, but the rubber sheet 30 has a part that covers the connector 22 that is provided so as to rise from the printed circuit board 20, so that it is preferable to guide it to the discharge hole 12 from that part. As its configuration, it is preferable that the rubber sheet 30 extends toward the operating mechanism plate 60, the tip of the rubber sheet 30 abuts against the operating mechanism plate 60, and the rubber sheet 30 has a connector portion discharge path 32 that guides the liquid entering the housing 10 through the insertion hole 11 via the communication hole 61 to the discharge hole 12 (FIG. 3E). The connector portion discharge path 32 has one end connected at a part of the rubber sheet 30 that covers the connector 22, extends to be inclined from the one end toward the discharge hole 12 provided on the bottom surface, and has the other end 34 formed in the vicinity of the bottom surface. The other end 34 is separated from the rubber sheet 30 that covers the connector 22, and a gap 33 that does not cause capillary phenomenon exists between the lower end portion of the rubber sheet 30 that covers the connector 22 and the other end 34.

In this manner, the connector portion discharge path 32 that guides the liquid formed on the rubber sheet 30 to the discharge hole 12 extends from the rubber sheet 30 that covers the connector 22 toward the discharge hole 12 in an inclined manner, and the tip thereof (the other end 34) is separated from the rubber sheet 30 that covers the connector 22, and a gap 33 exists between the tip and the rubber sheet 30 that covers the connector 22, so that it is possible to prevent entry of the liquid from the connector opening 17 of the connector 22.

It is preferable that a connector opening wall 18 extending downward is provided around the connector opening 17. According to this, it is possible to prevent the liquid discharged from the discharge hole 12 from exceeding the connector opening wall 18 and entering the connector 22. In addition, it is preferable that a discharge hole wall 13 extending downward is provided around the discharge hole 12. According to this, the liquid discharged from the discharge hole 12 falls further downward, so that it can be prevented from entering the connector 22.

It is preferable that a raised portion 19 that rises upward is provided at an end portion of the top surface of the housing 10 on a side of the back cover 70 (FIG. 2, FIG. 5, FIG. 7A, FIG. 7B, and the like). As a result, this prevents the liquid from coming around from the back surface side and entering the housing 10.

In addition, the switch device 100 may be provided as an assembly 1 together with a design cover 200 that is attached to the switch device 100, exposes the operating knob 40 from the front surface, and covers at least the top surface and the front surface of the switch device 100 (FIGS. 4A to 8B). Accordingly, this provides an assembly 1 that is aesthetically pleasing and prevents liquid from entering the inside the housing 10.

The present invention is not limited to the described embodiments and can be implemented by a configuration within a range that does not depart from the content described in each section of the claims. That is, the present invention is mainly and particularly shown and described with respect to a specific embodiment, and those skilled in the art can make various modifications in the quantity and other detailed configurations with respect to the above-described embodiments without departing from the scope of the technical idea and the objects of the present invention.

While the invention has been described with respect to a limited number of embodiments, those skilled in the art, having benefit of this disclosure, will appreciate that other embodiments can be devised which do not depart from the scope of the invention as disclosed herein. According, the scope of the invention should be limited only by the attached claim(s).

The invention claimed is:

1. A switch device comprising:
   a printed circuit board which includes an electrical contact and on which an electronic component is mounted;
   a rubber sheet configured to cover the printed circuit board, the rubber sheet having a rubber dome at a position corresponding to the electrical contact;
   an operating knob configured to operate the rubber dome, the operating knob being operable for turning on/off the electrical contact;
   an operating mechanism interposed between the operating knob and the rubber dome, the operating mechanism being configured to transmit force applied to the operating knob to the rubber dome;
   an operating mechanism plate on which the operating mechanism is provided; and
   a housing having a side surface provided with an insertion hole for inserting a part of the operating mechanism, the part of the operating mechanism being connected to the operating knob, and a bottom surface provided with a discharge hole for discharging liquid entering an inside of the housing; and
   a back cover that is fitted from a back side of the housing and sandwiches an entire periphery of the rubber sheet with a stepped portion formed inside the housing,
   wherein the printed circuit board is stored in a space between the back cover and the rubber sheet,
   wherein the discharge hole is located in a lower portion of a space between an inner surface of the housing and the rubber sheet, and
   wherein a bottom portion exists between the discharge hole and the rubber sheet.

* * * * *